United States Patent [19]
Kobori

[11] Patent Number: 6,100,190
[45] Date of Patent: Aug. 8, 2000

[54] METHOD OF FABRICATING SEMICONDUCTOR DEVICE, AND SEMICONDUCTOR DEVICE

[75] Inventor: Etsuyoshi Kobori, Kyoto, Japan

[73] Assignee: Rohm Co., Ltd., Kyoto, Japan

[21] Appl. No.: 09/251,425

[22] Filed: Feb. 17, 1999

[30] Foreign Application Priority Data

Feb. 19, 1998 [JP] Japan .................................. 10-037178

[51] Int. Cl.⁷ .................................................. H01L 21/47
[52] U.S. Cl. ......................... 438/659; 438/622; 438/637; 438/658; 438/675
[58] Field of Search ................................... 438/622, 637, 438/658, 659, 675

[56] References Cited

U.S. PATENT DOCUMENTS 5,933,761  6/1998  Lee .......................................... 438/783

OTHER PUBLICATIONS

"Making the Move to Dual Damascene Processing", *Semiconductor International*, Aug. 1997, pp. 79–82.

*Primary Examiner*—Charles Bowers
*Assistant Examiner*—Lisa Kilday
*Attorney, Agent, or Firm*—Morgan, Lewis & Bockius LLP

[57] ABSTRACT

Wiring of the Dual-Damascene structure is formed without using the CMP method.

As shown in FIG. 1A, oxygen ions are implanted from an upper surface under the condition that the oxygen ions reach a position a little deeper than the thickness t1 of the copper film 11 on the $SiO_2$ layer 2. Due to the foregoing, as shown in FIG. 1B, the copper film 11 on the $SiO_2$ layer 2 and the copper films on the upper portions of the first wiring section 18 and the second wiring section 19 are oxidized, and the oxidized layer 13 is formed. Since the dielectric constant of copper oxide is high, the first wiring section 18 and the second wiring section 19 are insulated from each other. Therefore, it is possible to obtain a highly reliable wiring structure easily.

14 Claims, 7 Drawing Sheets

METHOD OF FABRICATING SEMICONDUCTOR DEVICE, AND SEMICONDUCTOR DEVICE

BACKGROUND OF THE INVENTION

1. Technical Field of the Invention

The present invention relates to a method of fabricating a semiconductor device. Also, the present invention relates to a semiconductor device fabricated by the above method. More particularly, the present invention relates to a simplification of a process of fabricating a semiconductor device.

2. Description of the Related Art

Recently, the size of a semiconductor device has been greatly reduced and its structure has been highly integrated. In accordance with that, a method of wiring of Dual-Damascene structure is known, in which upper metal wires 8a and 8b are embedded in an insulating layer as shown in FIG. 7. When the Dual-Damascene structure is adopted, it becomes possible to form wiring made of a material such as copper, which is difficult to be etched.

Referring to FIGS. 8A to 8C, a method of fabricating a wiring of the Dual-Damascene structure will be explained below. First, a resist pattern used for forming contact holes is formed on the $SiO_2$ layer 2 as an insulating film and the $SiO_2$ layer 2 is selectively etched to form contact holes. Successively, a resist pattern used for forming grooves is formed on the $SiO_2$ layer 2 and the $SiO_2$ layer 2 is selectively etched to form grooves. Due to the foregoing, as shown in FIG. 8A, a groove 6a for the first wiring section, contact hole 4a, groove 6b for the second wiring section and contact hole 4b are formed. FIG. 8B is a view taken in the direction of arrow A in FIG. 8A.

Then, a copper film 11 is formed all over the surface by the method of plating. Due to the foregoing, the copper film is embedded in the grooves 6 and the contact holes 4, and an upper surface of the $SiO_2$ layer 2 is covered with the copper film 11 as shown in FIG. 8C.

Next, copper film formed on portions except for in the grooves 6 and the contact holes 4 is removed by the method of chemical mechanical polishing (CMP method). Due to the foregoing, the first wiring section 18 and the second wiring section 19 are insulated from each other as shown in FIG. 7.

However, according to the above fabricating method, the following problems may be encountered. In order to insulate the first wiring section 18 and the second wiring section 19 from each other, it is indispensable to use the CMP method. Therefore, it is necessary to provide a device of CMP. Especially, when the CMP method is adopted, it is necessary to appropriately select chemicals and abrasive materials. Accordingly, when a wiring layer is made of a new metal, much time and expense are required for the investigation.

SUMMARY OF THE INVENTION

It is an object of the present invention to solve the above problems and provide a method of wiring a semiconductor device by which a plurality of wiring patterns can be isolated from each other without using the CMP method.

A first aspect of the method is a method of wiring a semiconductor device which comprises the steps of: forming a first insulating layer on a substrate surface; forming a plurality of grooves for a first wiring layer, which are separate from each other, on a surface of the first insulating layer; forming a conductive layer for wiring so that the grooves for the first wiring layer can be embedded and the first insulating layer can be covered by the conductive layer; and forming a second insulating layer by implanting oxygen ions from an upper surface of the conductive layer so that a portion of the conductive layer is oxidized, the conductive layer in the grooves for the first wiring layer is electrically isolated each other to form a first wiring layer According to the above arrangement, the wiring patterns constitute the first wiring layer are electrically insulated from each other by oxidizing a portion of the conductive layer by implanting oxygen ions from an upper surface of the conductive layer which is embedded in the plurality of grooves for wiring and covers the first insulating layer. Accordingly, it is possible to insulate the wiring patterns on the first wiring layer from each other without removing the conductive layer. Therefore, it is possible to easily form a highly reliable wiring without using a specific etching solution.

A second aspect of the method is a method of fabricating a semiconductor device according to the first aspect, wherein the step of forming the first insulating layer comprises a step of forming the first insulating layer on a surface of the semiconductor substrate in which elements are formed, and a step of forming a contact hole in a bottom of the groove for the first wiring layer so that the contact hole can come into contact with a surface of the semiconductor substrate before forming the conductive layer.

According to the above method, wiring of Dual-Damascene structure can be formed very easily.

A third aspect of the method is a method of fabricating a semiconductor device according to the first aspect, wherein oxygen ions are implanted in the oxygen ion implanting step to a depth at which a conductive layer above an upper edge of the groove for the first wiring layer is oxidized.

A fourth aspect of the method is a method of fabricating a semiconductor device according to the first aspect, wherein oxygen ions are implanted in the oxygen ion-implanting step to a depth at which an upper layer of the first wiring layer is oxidized.

According to the method of fabricating a semiconductor device of the present invention, oxygen ions are implanted so that an upper layer of the first wiring layer can be oxidized. Therefore, a conductive layer located above the surface of the first insulating layer can be completely oxidized. Due to the foregoing, the wiring patterns on the first wiring layer can be completely insulated from each other.

A fifth aspect of the method is a method of fabricating a semiconductor device according to the first aspect, further comprising the step of forming a third insulating layer on the second insulating layer.

According to the method of fabricating a semiconductor device of the present invention, an insulating layer is further formed on the oxidized semiconductor layer. Accordingly, the wiring patterns on the first wiring layer can be more completely isolated from each other.

A sixth aspect of the method is a method of fabricating a semiconductor device according to the first aspect, further comprising the steps of selectively removing the second insulating layer, and forming a third insulating layer on the surface on which the second insulating layer is removed.

A seventh aspect of the method is a method of fabricating a semiconductor device according to the sixth aspect, wherein the step of removing comprises a step of removing selectively the second insulating layer by the etching selectivity between the second insulating layer consists of the oxidized conductive layer and the remaining conductive layer which remains without being oxidized.

An eighth aspect of the method is a method of fabricating a semiconductor device according to the first aspect, wherein the step of removing comprises a step of removing by the chemical mechanical polishing method (CMP).

A ninth aspect of the method is a method of fabricating a semiconductor device according to the first aspect, wherein the conductive layer is made of a metal layer.

A tenth aspect of the method is a method of fabricating a semiconductor device according to the first aspect, wherein the conductive layer is made of aluminum.

An eleventh aspect of the method is a method of fabricating a semiconductor device according to one of the first aspect, wherein the conductive layer is made of a polycrystalline silicon layer.

A twelfth aspect of the method is a method of fabricating a semiconductor device according to the sixth aspect, wherein the conductive layer is constituted by a polycrystalline silicon layer, and the step of removing comprises a step of removing oxidized silicon selectively by using the etching selectivity between polycrystalline silicon and oxidized silicon.

A thirteenth aspect of the method is a method of fabricating a semiconductor device according to the sixth aspect, further comprising the steps of: forming a plurality of grooves for the second wiring layer, which are separate from each other, on a surface of the third insulating layer; forming a second conductive layer for wiring so that the grooves for the second wiring can be filled and the third insulating layer can be covered; and forming a fourth insulating layer by oxidizing a portion of the conductive layer when oxygen ions are implanted from an upper surface of the second conductive layer and also forming a second wiring layer by electrically insulating the second conductive layer in the grooves for the second wiring layer.

A fourteenth aspect of the method is a method of fabricating a semiconductor device according to the thirteenth aspect, further comprising the step of forming second contact holes at bottom portions of the grooves for the second wiring layer so that the second contact holes can come into contact with the surface of the semiconductor substrate or the first wiring layer before forming the second conductive layer.

A fifteenth aspect of the device is a semiconductor device which comprises: a first wiring layer constituted by a plurality of wiring patterns separate from each other embedded in an upper surface of the first insulating layer which covers the surface of the semiconductor substrate; and a nonconductive layer formed by the oxidation of material of the first wiring layer, wherein the nonconductive layer comes into contact with the first wiring layer and covers the first insulating layer.

The semiconductor device of the present invention comprises a nonconductive layer made of material obtained by oxidizing the first wiring metal, wherein the nonconductive layer comes into contact with the patterns on the first wiring layer and covers the first insulating layer. Accordingly, the patterns on the first wiring layer can be isolated without removing the nonconductive layer on the first insulating layer.

DESCRIPTION OF THE PREFERRED EMBODIMENTS

Figure 1A:
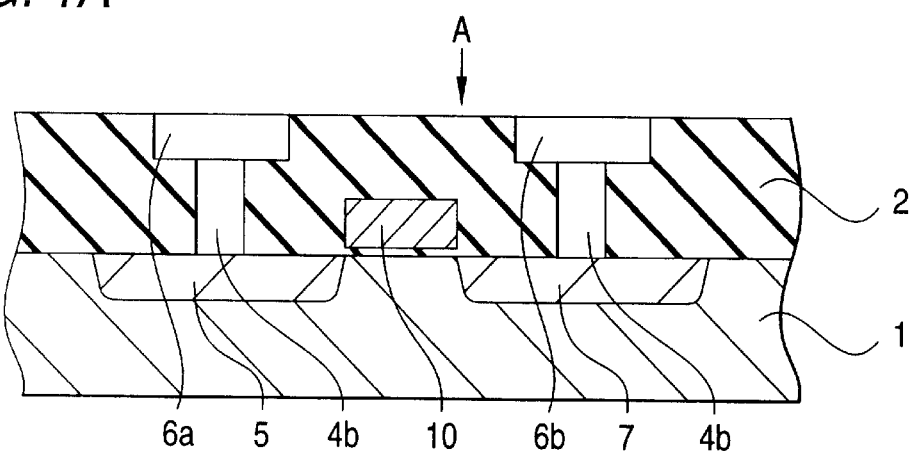
FIGS. 1A–1C are views showing a process of fabricating a wiring of the first embodiment of the present invention.
Figure 1B:
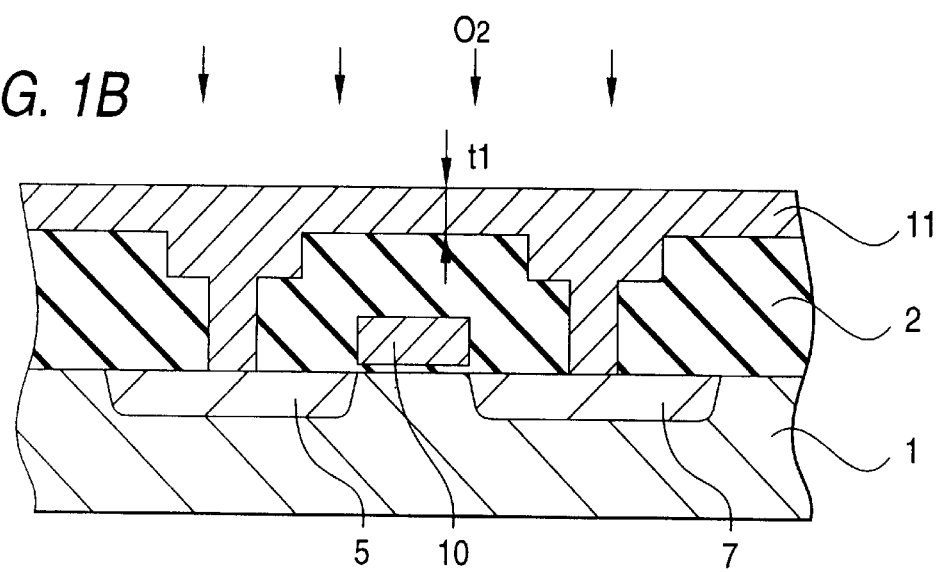
Figure 1C:
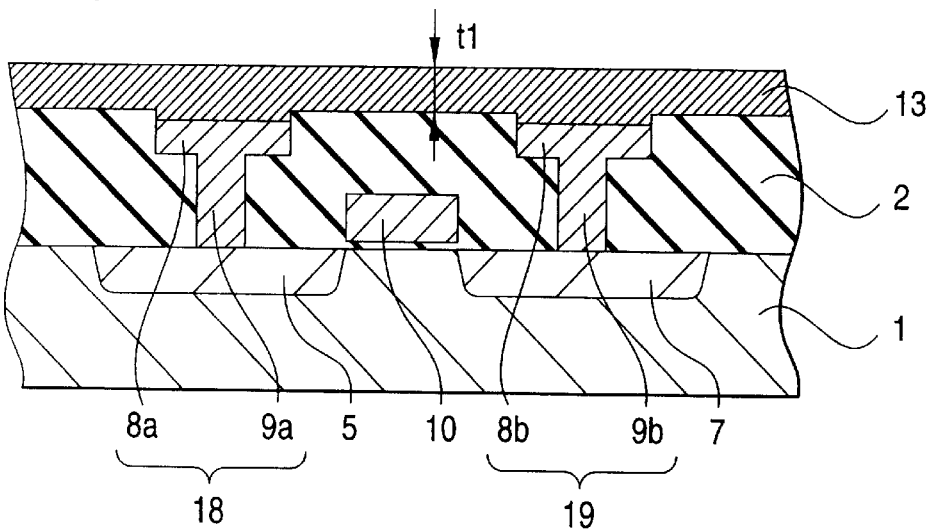

Referring to the accompanying drawings, a method of fabricating of the first embodiment of the present invention will be explained below. FIGS. 1A–1C are views showing a process of fabricating a wiring in a semiconductor device of the first embodiment of the present invention. According to the process, as shown in FIG. 1C, semiconductor device of Dual-Damascene structure is formed.

The process will be explained. First, in the same manner as that of the conventional method of fabricating, an $SiO_2$ layer 2, the thickness of which is 1.7 to 2.5 $\mu$m, is formed by the method of CVD so that a surface of the silicon substrate 1 can be covered with the $SiO_2$ layer 2 as shown in FIG. 1A. In this case, reference numeral 5 is a source region, reference numeral 7 is a drain region, and reference numeral 10 is a gate electrode. In the $SiO_2$ layer, contact holes 4a, 4b, the opening diameters of which are 0.15 to 1.5 $\mu$m, are formed by the method of photolithography so that the contact holes 4a, 4b can be contacted with the source region 5 and the drain region 7. Successively, a groove 6a for wiring, the width of which is 0.18 to 2.0 $\mu$m, the depth of which is 0.7 to 1.7 $\mu$m, is formed so that it can contain the contact hole 4a. Also, a groove 6b for wiring, the width of which is 0.18 to 2.0 $\mu$m, the depth of which is 0.7 to 1.7 $\mu$m, is formed so that it can contain the contact hole 4b.

Next, as shown in FIGS. 1B, a copper film 11 is deposited all over the surface by the method of plating. In this case, usually, a thinner copper film is previously formed by the method of spattering before plating, and then a copper film is formed on this thinner copper film by the method of electrolytic plating. At this time, film thickness of the copper film formed on the $SiO_2$ layer 2 is adjusted to be 500 to 3000 nm. In order to prevent from forming voids in the copper film within the contact hole, heating is conducted in an atmosphere, the temperature of which is 450 to 500° C., the pressure of which is 70 Mpa.

Due to the foregoing, as shown in FIG. 1B, the grooves 6a, 6b for wiring and the contact holes 4a, 4b are filled with the copper film 11, and further an upper surface of the $SiO_2$ layer 2 is covered with the copper film 11.

Under the above condition, oxygen ions are implanted from an upper surface to a position, which is deeper than the film thickness t1 of the copper film 11 on the $SiO_2$ layer 2. In this case, a dose of oxygen ions is $1\times10^{14}$ to $1\times10^{15}$ cm$^{-2}$, and an intensity of implanted energy is 1 to 2 MeV.

Due to the foregoing, the copper film on the upper portion of the copper film 11 on the $SiO_2$ layer 2 and also the copper films on the upper portions of the first wiring section 18 and the second wiring section 19 are oxidized, and a copper oxide layer 13 is formed as shown in FIG. 1C. Since the dielectric constant of copper oxide is high (ε=18.1), the first wiring section 18 and the second wiring section 19 are insulated from each other. As described above, the wiring pattern can be formed without etching the copper film, and the wiring of the Dual-Damascene structure can be formed. As shown in FIG. 1C, the first wiring section 18 and the second wiring section 19, which are made of copper films, are formed on the $SiO_2$ layer 2. The first wiring section 18 is provided with a plug 9a and a first metal wire 8a. In the same manner, the second wiring section 19 is provided with a plug 9b and a second metal wire 8b. An oxide layer 13 made of copper oxide is formed on the $SiO_2$ layer 2. In this connection, concerning the upper layers of the first metal wire 8a and the second metal wire 8b, oxidation is conducted to a position deeper than the upper surface of the $SiO_2$ layer 2.

As described above, unlike the conventional method, the copper film 11, which is formed in portions except for the first metal wire 8a and the second metal wire 8b, is not removed, but it is oxidized so that it can be changed into an insulator. Therefore, it is unnecessary to provide a copper film removing process in which the method of CMP is used.

In this connection, in the above embodiment, a method of forming a wiring contacts with the source/drain region in MOSFET, is explained. However, it should be noted that the present invention is not limited to the above specific embodiment in which the wire is contacted with the surface of the substrate. Of course, it is possible to apply the present invention to the formation of an electrode wire and a upper layer wire, and also it is possible to apply the present invention to the formation of a wiring pattern on the surface of an insulating substrate or a film carrier. In the above embodiment, the plug and the wiring are made of the same material, however, it should be noted that the present invention is not limited to the above specific embodiment.

Figure 2:
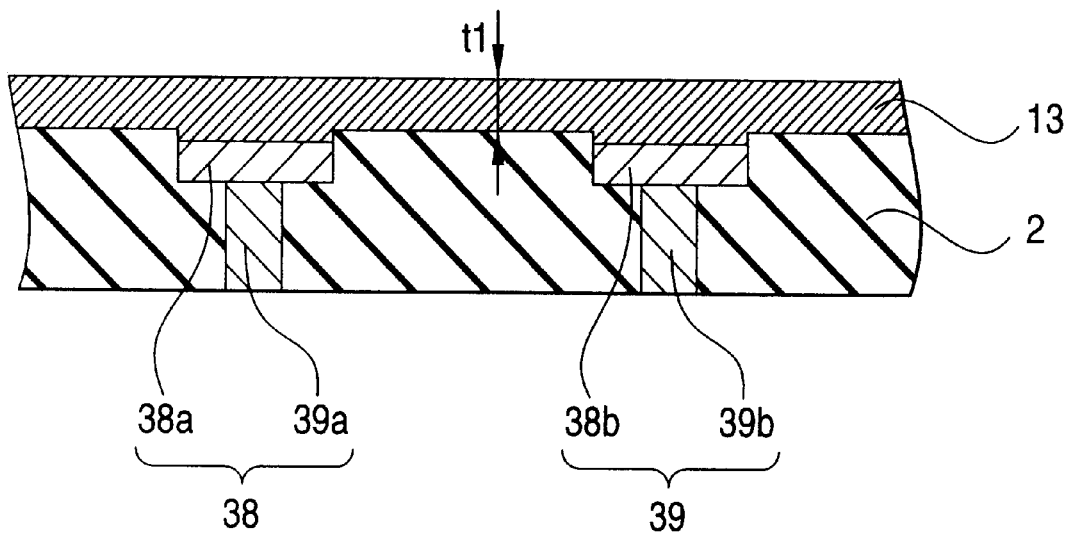
FIG. 2 is a view showing a wiring structure of the second embodiment of the present invention.

For example, as shown in the second embodiment illustrated in FIG. 2, the plug may be made of a polycrystalline silicon layer 39a, 39b which is formed by the selective vapor phase growing method or CVD method, and the wiring region may be made of a metal thin film 38a, 38b such as aluminum.

Figure 3:
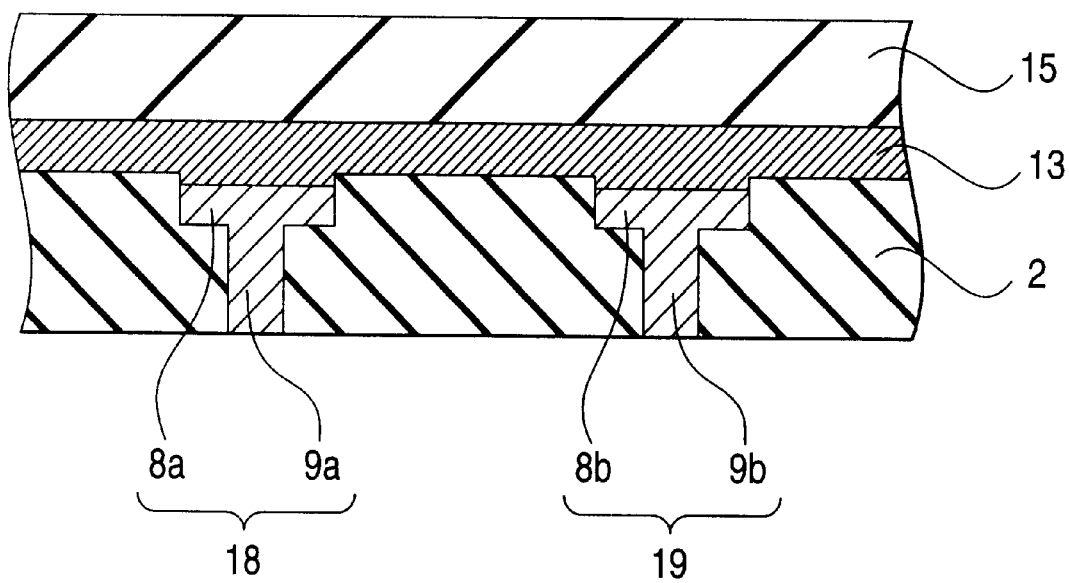
FIG. 3 is a view showing a wiring structure of the third embodiment of the present invention.

In order to enhance the insulating property, as the third embodiment, an insulating film 15 made of PSG film, the thickness of which is approximately 1 μm, may be formed on the oxidized layer 13 as shown in FIG. 3. Due to the foregoing, even when upper wiring is further formed on the upper surface, it is possible to isolate the first and second wiring sections 18,19, and the upper wiring formed on the first and second wiring sections 18,19 completely.

As described above, the wiring of the Dual-Damascene structure can be formed as shown in FIG. 3.

Figure 4A:
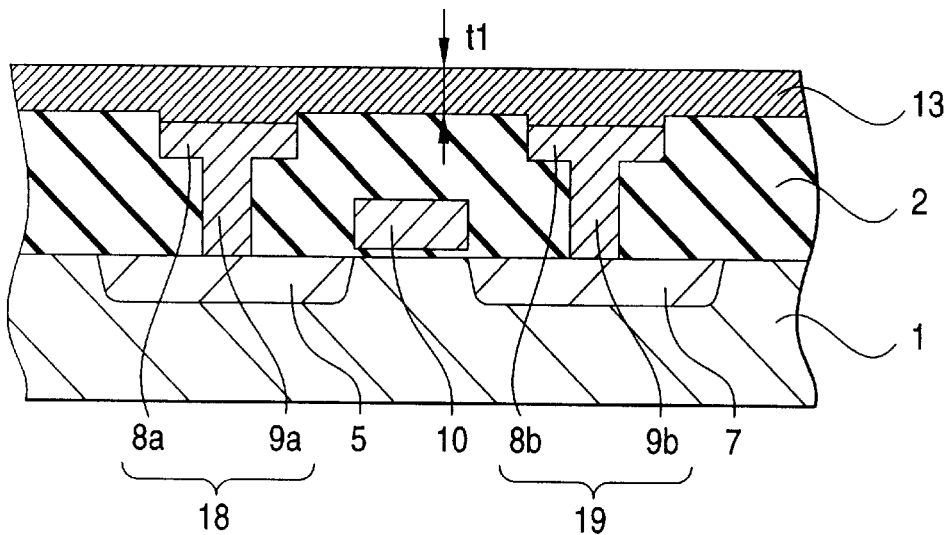
FIGS. 4A–4C are views showing a process of fabricating a wiring of the fourth embodiment of the present invention.
Figure 4B:
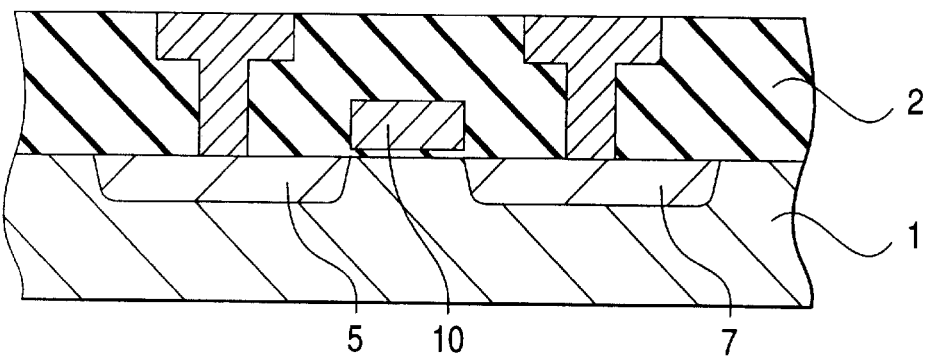

As the fourth embodiment of the present invention, in the same manner as that of the first embodiment shown in FIG. 1C, the oxidized layer 13 is formed as shown in FIG. 4A. Then, as shown in FIG. 4B, only copper oxide 13 is selectively removed under the etching condition in which copper oxide is selectively etched with respect to copper. Namely then copper oxide is selectively etched and copper is remained. In this case, as an example of the etching a wet etching solution containing N-methylethanol amine is used.

Figure 4C:
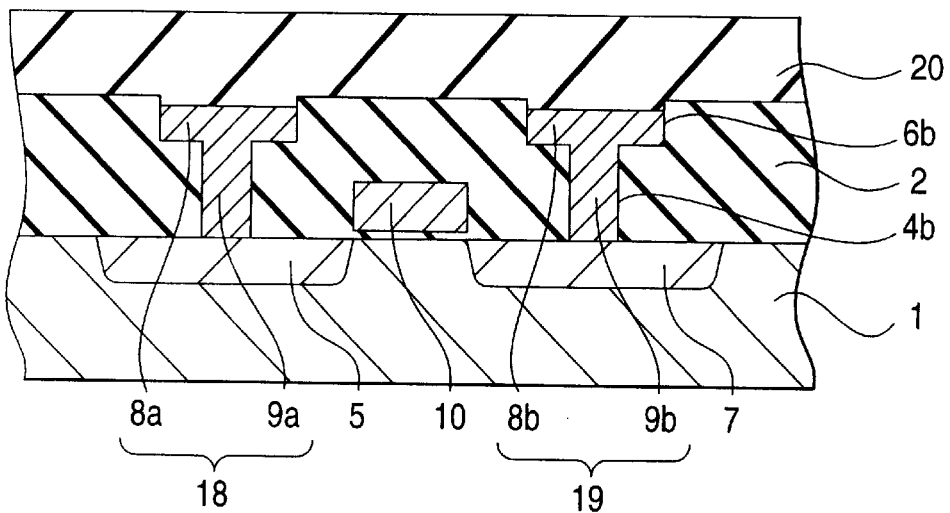

After that, as shown in FIG. 4C, BPSG film, the thickness of which is 1 μm, is newly deposited so that it can be used as an insulating layer 20. In this way, an insulating film of high quality is formed. In this case, when ions are implanted to a depth at which the surfaces of the first and second metal wirings 8a, 8b of the first and second wiring sections 18,19 are slightly oxidized, more perfect and reliable insulation can be accomplished.

When the above selective etching is conducted, it is possible to conduct etching easily compared with a case in which CMP method is used, and further the etching solution can be easily selected. Furthermore, it is possible to conduct a selective removing action more positively. Also, it becomes possible to conduct a selective removing in a dry process such as an ashing method. Therefore, it is possible to form a highly reliable semiconductor device while pollution in the element region is prevented.

As described above, a surface of the wiring substrate of the Dual-Damascene structure on which the insulating layer 20 is formed is flat and the insulating property is high. Further, as shown in FIG. 5, it is possible to further laminate a wiring layer of the same Dual-Damascene structure on the surface.

Figure 5:
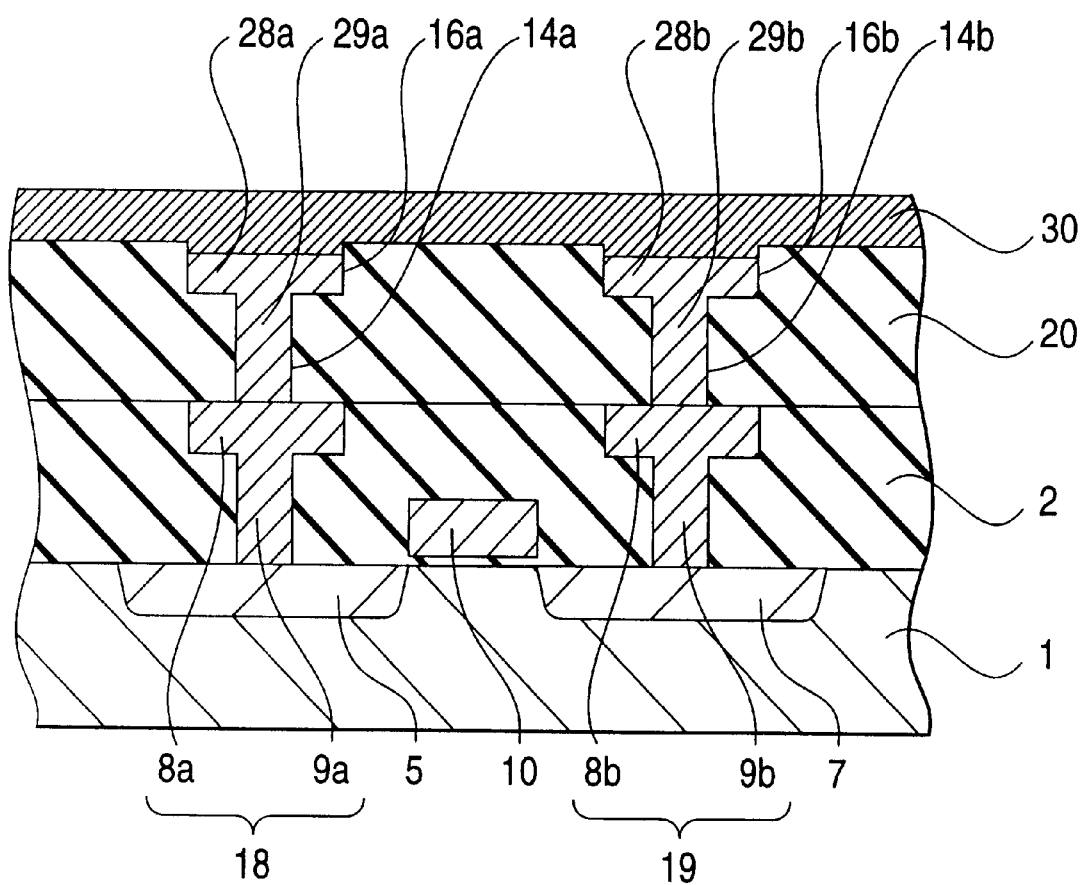
FIG. 5 is a view showing a wiring structure of the fifth embodiment of the present invention.

FIG. 5 is a view showing a semiconductor device having a wiring of the Dual-Damascene structure composed of two layers, which is the fifth embodiment of the present invention. In this case, the wiring structure of the upper layer is formed in the same manner as that shown in FIGS. 4A to 4C as follows. The contact holes 14a, 14b are formed in the insulating layer 20; the second layer wiring grooves 16a, 16b are formed at the same time; copper plating is conducted, so that a copper film is formed in the contact holes 29a, 29b and the second layer wiring grooves 28a, 28b; the copper film on the insulating film 20 is oxidized by implanting oxygen ions, so that the oxidized layer 30 is formed and the patterns of the second layer wiring are separated from each other. As described above, it is possible to form a wiring of the two layers-Dual-Damascene structure very easily.

According to the above structure, the surface is formed very flat. Therefore, even when a multiple layer wiring structure is formed, it is possible to obtain a highly reliable semiconductor device very easily.

Figure 6A:
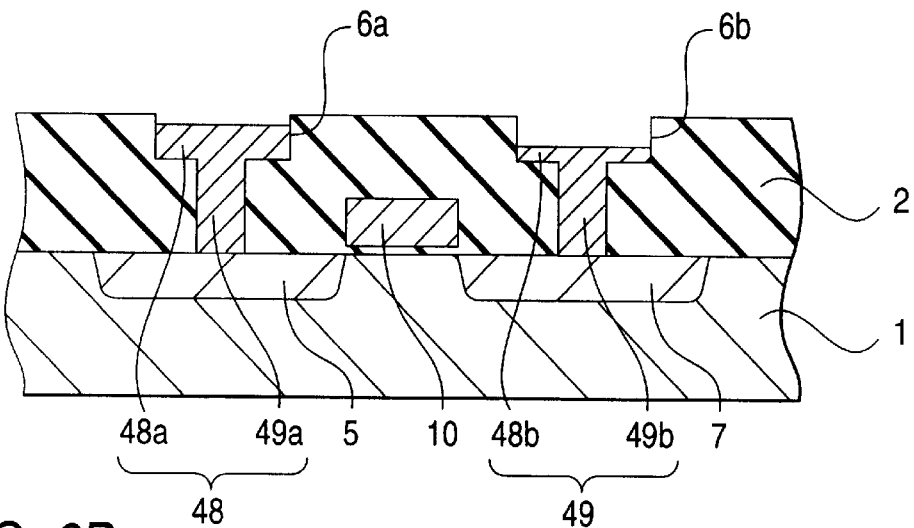
FIGS. 6A–6C are views showing a process of fabricating a wiring of the sixth embodiment of the present invention.
Figure 6B:
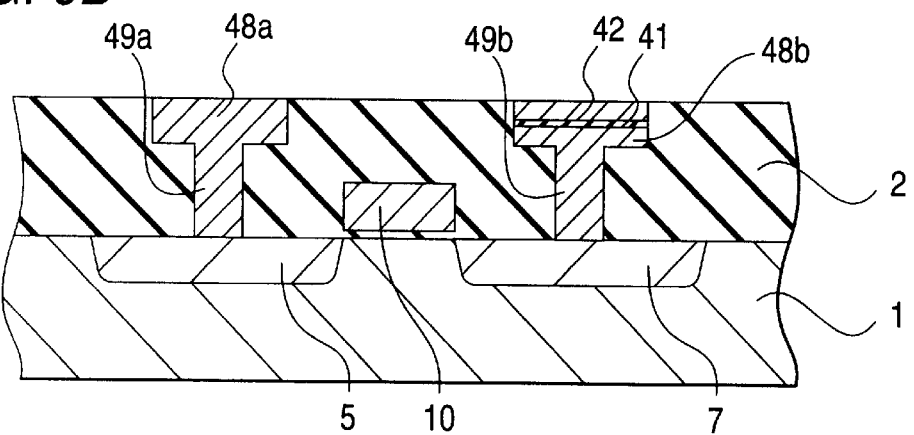
Figure 6C:
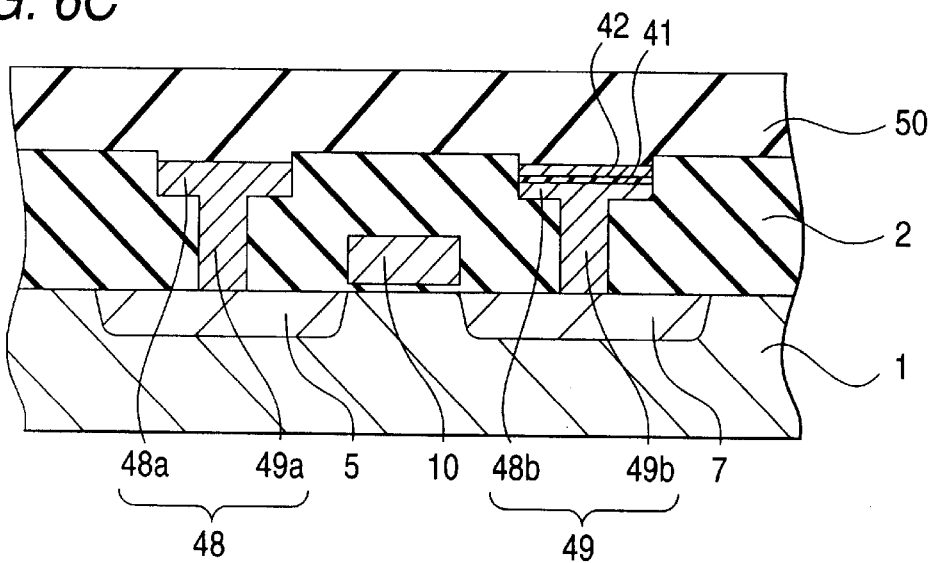
Figure 7:
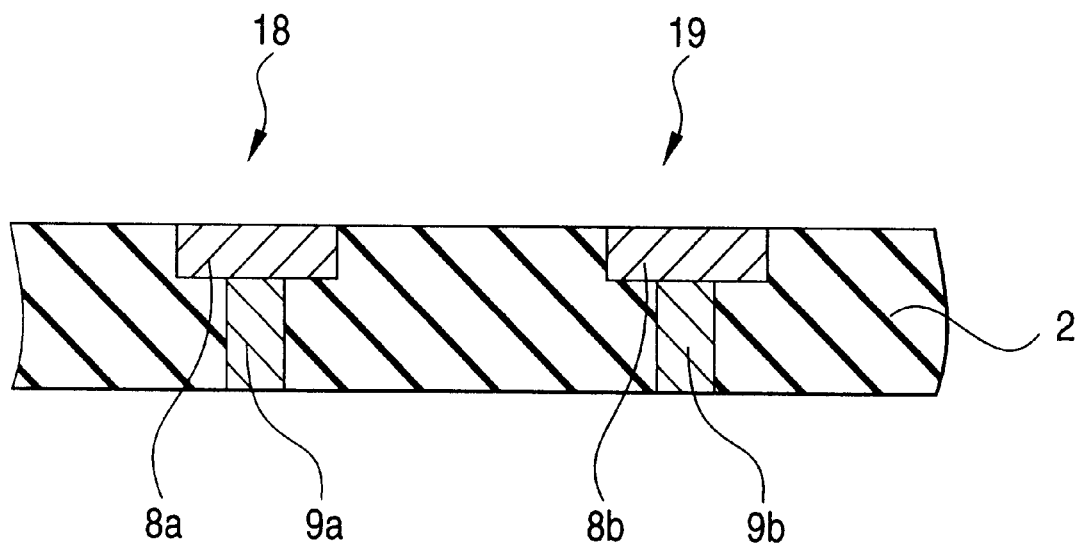
FIG. 7 is a cross-sectional view showing a primary portion of a semiconductor device for explaining the Dual-Damascene structure.
Figure 8A:
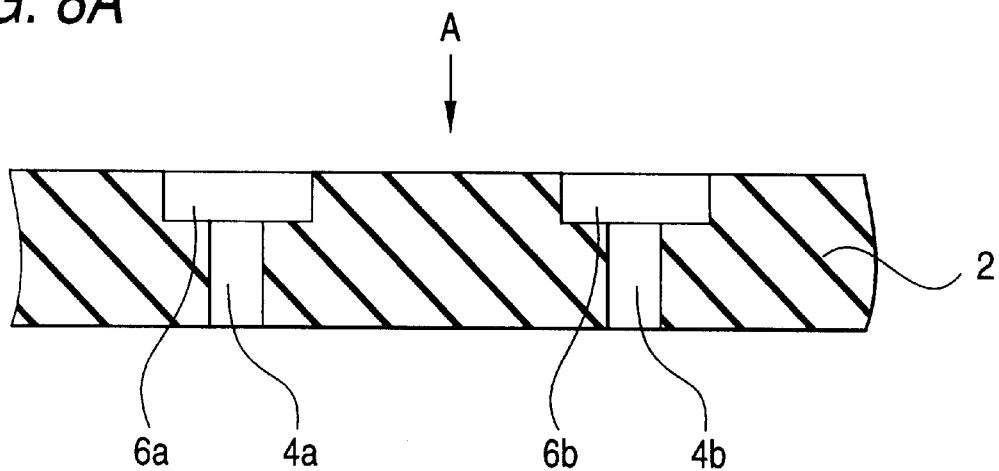
FIGS. 8A–8C are views showing a conventional fabricating structure.
Figure 8B:
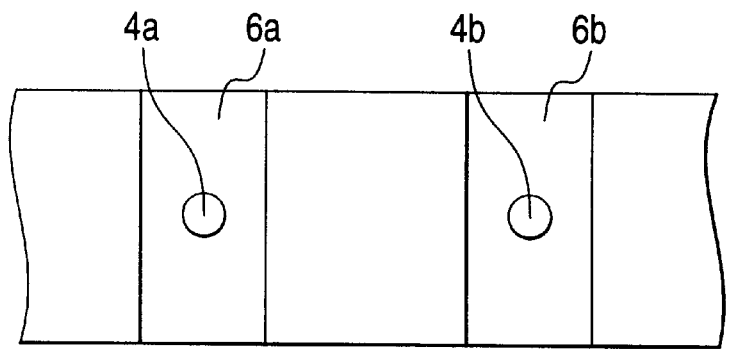
Figure 8C:
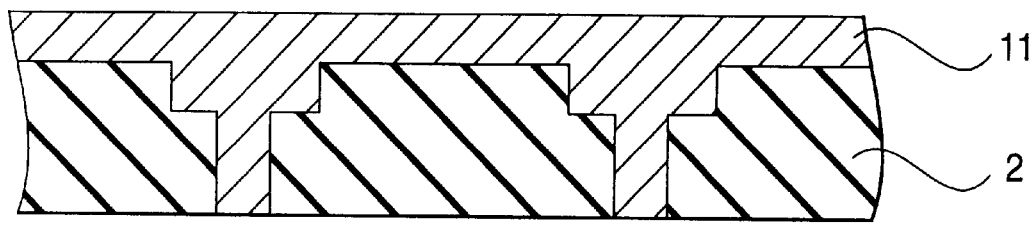

As shown in FIG. 6, a sixth embodiment of the present invention is provided, in which capacitors are formed in the grooves. In the same manner as that of the fourth embodiment shown in FIGS. 4A–4C, contact holes are formed in the insulating layer 2; the first layer wiring grooves are formed; a tantalum thin film is formed by means of spattering, so that the thin tantalum film as a wiring layer is formed in the contact holes and the first layer wiring grooves; the tantalum film on the insulating layer 2 is oxidized by implanting oxygen ions, so that the oxidized layer 13 made of tantalum oxide is formed and the patterns of the first wiring layer are separated from each other. The above process is the same as that shown in FIG. 4B. After that, as shown in FIG. 6A, a portion of the surface of the second metal wiring section 48b on the drain side is selectively removed. At this time, it is necessary to cover the source region and so on with resist. On the other hand, on the drain side, upper part of the tantalum thin film in the wiring groove 6b is selectively etched in self-alignment by the etching selectivity between the tantalum thin film and the insulating layer 2 made of silicon oxide film without forming a mask.

After that, PZT film, which is used as a dielectric film 41, is formed on the second metal wiring section 48b by the method of spattering or the method of sol-gel, and further the upper electrode 42 made of a copper film is formed on PZT film. When this upper electrode 42 is formed, the upper portion of the wiring groove 6b is filled with the copper thin film, and in the same manner as that of the fourth embodiment, a copper thin film is filled in the wiring groove, and the copper thin film on the surface is oxidized to be copper oxide film by implanting oxygen ions. Then, the copper oxide film is etched away, after that the insulating film 50 made of PSG film is formed. In this way, it is possible to obtain a semiconductor device having a capacitor in which a dielectric film is interposed between the lower electrode and the upper electrode 42, wherein the lower electrode is made of the second metal wiring section 48*b* on the first wiring layer.

Due to the above structure, it is unnecessary to provide a process in which a dielectric film such as a PZT thin film is subjected to patterning. Therefore, it is possible to provide a highly reliable semiconductor device without the occurrence of deterioration of film quality.

In this connection, in the above example, a PZT thin film is formed by means of spattering. However, a dielectric film may be formed by means of implanting ions to a metal film or oxidizing a surface of the metal film, and the thus formed dielectric film may be used as a dielectric film of the capacitor. In the case that as a dielectric film of a capacitor, Ferro-dielectric film is used, an appropriate film such as $IrO_2$ can be interposed preferably between the lower or upper electrode and the dielectric film, in order to improve orientation of the Ferro-dielectric film.

In the above example, the upper electrode is formed in such a manner that it is embedded in the wiring groove. However, only the dielectric film may be embedded in the wiring groove, and the upper electrode may be patterned by means of photolithography after forming a thin film. In the case of a device in which the upper electrode is used as a common electrode, it is unnecessary to provide a patterning process.

The metal thin film in the plug may not be necessarily formed in one process. It is possible to adopt an appropriate alternative in which both the selection growing method and the CVD method are used.

In this embodiment, wiring is made of copper. However, the present invention is not limited to the above specific embodiment. As long as a conductive layer is used as wiring, the present invention can be applied to any conductive layer. Examples of material of the conductive layer are: aluminum, tantalum and titanium. Also, the present invention can be applied to metal, the principle component of which is aluminum or copper, for example, the present invention can be applied to aluminum silicon (AlSi) or aluminum silicon copper (AlSiCu). Further, the present invention can be applied to a chemical compound of aluminum and tungsten or a chemical compound of copper and tungsten. Furthermore, the present invention can be applied to a highly doped polycrystalline silicon layer Concerning aluminum, abrasive and solvent used for removing by the CMP method have not been developed at present. Accordingly, when the fabricating method of the present invention is used, aluminum can be used for the wiring of the Dual-Damascene structure.

In this embodiment, oxygen ions are implanted to a position a little deeper than the upper surface of the $SiO_2$ layer 2. However, if it is possible to highly accurately control the depth of implantation of ions and positively insulate the first wiring section 18 and the second wiring section 19 from each other, oxygen ions may be implanted so that oxidation can be conducted to the same depth as that of the upper surface of the $SiO_2$ layer 2.

In this embodiment, the present invention is applied to a case in which the shallow grooves for wiring of the Dual-Damascene structure are formed and also the deep holes are formed. However, the present invention is not limited to the Dual-Damascene structure. In the case where a groove is formed on an insulating layer and a conductor is embedded in the groove, the present invention can be also applied.

In the above example, the semiconductor device has the Dual-Damascene structure composed of one layer. Of course, it is possible to apply the present invention to a semiconductor device having the Dual-Damascene structure of the multiple layer, the number of the layers of which is not less than two.

What is claimed is:

1. A method of fabricating a semiconductor device comprising the steps of:

forming a first insulating layer on a substrate surface;

forming a plurality of grooves for a first wiring layer, which are separate from each other, on a surface of the first insulating layer;

forming a conductive layer for wiring so that the grooves for the first wiring layer can be embedded and the first insulating layer can be covered with the conductive layer; and forming a second insulating layer by implanting oxygen ions to the conductive layer from an upper surface of that so that a portion of the conductive layer is oxidized, and the conductive layer in the grooves for the first wiring layer is electrically isolated each other to form a first wiring layer.

2. The method of fabricating a semiconductor device according to claim 1, wherein the step of forming the first insulating layer comprises a step of forming a first insulating layer on the substrate in which elements are formed, and the method further comprises a step of forming a contact hole in a bottom of the groove for the first wiring layer so that the contact hole can come into contact with a surface of the semiconductor substrate before forming the conductive layer.

3. The method of fabricating a semiconductor device according to claim 1, wherein the oxygen ions are implanted to a depth at which a conductive layer above an upper edge of the groove for the first wiring layer is oxidized.

4. The method of fabricating a semiconductor device according to claim 1, wherein oxygen ions are implanted in the oxygen ion implanting step to a depth at which an upper layer of the first wiring layer is oxidized.

5. The method of fabricating a semiconductor device according to claim 1, further comprising the step of forming a third insulating layer on the second insulating layer.

6. The method of fabricating a semiconductor device according to claim 1, further comprising the steps of selectively removing the second insulating layer, and forming a third insulating layer on the surface on which the second insulating layer is removed.

7. The method of fabricating a semiconductor device according to claim 6, wherein the step of removing comprises a step of removing selectively the second insulating layer made of the oxidized conductive layer by using the etching selectivity between the second insulating layer compose d of the oxidized conductive layer and the conductive layer which remains without being oxidized.

8. The method of fabricating a semiconductor device according to claim 1, wherein the step of removing comprises a step of removing by the chemical mechanical polishing method (CMP).

9. The method of fabricating a semiconductor device according to claim 1, wherein the conductive layer made of a metal layer.

10. The method of fabricating a semiconductor device according to claim 1, wherein the conductive layer is made of aluminum.

11. The method of fabricating a semiconductor device according to claim 1, wherein the conductive layer is made of polycrystalline silicon.

12. The method of fabricating a semiconductor device according to claim 6, wherein the conductive layer is made of a polycrystalline silicon layer, and the step of removing comprises a step of removing a oxidized silicon selectively removed by the etching selectivity between polycrystalline silicon and oxidized silicon.

13. The method of fabricating a semiconductor device according to claim 6, further comprising the steps of:

forming a plurality of grooves for the second wiring layer, which are separate from each other, on a surface of the third insulating layer;

forming a second conductive layer for wiring so that the grooves for the second wiring can be filled and the third insulating layer can be covered; and forming a fourth insulating layer by oxidizing a portion of the conductive layer when oxygen ions are implanted from an upper surface of the second conductive layer and also forming a second wiring layer by electrically insulating the second conductive layer in the grooves for the second wiring layer.

14. The method of fabricating a semiconductor device according to claim 13, further comprising the step of forming second contact holes at bottom portions of the grooves for the second wiring layer before forming the second conductive layer so that the second contact holes can come into contact with the surface of the semiconductor substrate or the first wiring layer.

* * * * *